(12) United States Patent
Zhang et al.

(10) Patent No.: US 12,127,432 B2
(45) Date of Patent: Oct. 22, 2024

(54) DISPLAY PANEL AND DISPLAY APPARATUS

(71) Applicant: KunShan Go-Visionox Opto-Electronics Co., Ltd, Jiangsu (CN)

(72) Inventors: Lu Zhang, Kunshan (CN); Junhui Lou, Kunshan (CN); Feng Chen, Kunshan (CN); Yong Zhu, Kunshan (CN)

(73) Assignee: KunShan Go-Visionox Opto-Electronics Co., Ltd, Kunshan (CN)

( * ) Notice: Subject to any disclaimer, the term of this patent is extended or adjusted under 35 U.S.C. 154(b) by 370 days.

(21) Appl. No.: 17/859,257

(22) Filed: Jul. 7, 2022

(65) Prior Publication Data

US 2022/0336538 A1  Oct. 20, 2022

Related U.S. Application Data

(63) Continuation of application No. PCT/CN2021/096226, filed on May 27, 2021.

(30) Foreign Application Priority Data

Jul. 1, 2020  (CN) .......................... 202010621411.8

(51) Int. Cl.
  *H10K 59/121* (2023.01)
  *H10K 59/65* (2023.01)
(52) U.S. Cl.
  CPC ........... *H10K 59/121* (2023.02); *H10K 59/65* (2023.02)
(58) Field of Classification Search
  None
  See application file for complete search history.

(56) References Cited

U.S. PATENT DOCUMENTS

| | | | |
|---|---|---|---|
| 2016/0351633 A1 | 12/2016 | Kim et al. | |
| 2022/0157898 A1* | 5/2022 | Lou | ...................... H10K 59/121 |
| 2022/0293696 A1* | 9/2022 | Xin | ........................ H10K 59/88 |

FOREIGN PATENT DOCUMENTS

| | | |
|---|---|---|
| CN | 110071161 A | 7/2019 |
| CN | 110275358 A | 9/2019 |

(Continued)

OTHER PUBLICATIONS

The Notification to Grant issued Aug. 17, 2022, in corresponding to Chinese Application No. 202010621411.8, 8 pages (with English Translation).

(Continued)

*Primary Examiner* — Suberr L Chi
(74) *Attorney, Agent, or Firm* — Maier & Maier, PLLC

(57) ABSTRACT

The present application discloses a display panel and a display apparatus, where the display panel has a first display area and a second display area, and a boundary is provided between the first display area and the second display area, and the display panel comprises: a pixel unit layer comprising a first pixel group positioned in a first display area, a second pixel group positioned in a second display area and a third pixel group positioned in at least one of the first display area and the second display area and adjacent to a boundary, wherein the first pixel group comprises a plurality of first pixel units, and the first pixel unit comprises a first sub-pixel and a first virtual sub-pixel; the third pixel group comprises two third pixel units which correspond to one first pixel unit.

20 Claims, 6 Drawing Sheets

(56) References Cited

FOREIGN PATENT DOCUMENTS

| | | | |
|---|---|---|---|
| CN | 110379836 A | 10/2019 |
| CN | 110783384 A | 2/2020 |
| CN | 110783386 A | 2/2020 |
| CN | 110890026 A | 3/2020 |
| CN | 111192902 A | 5/2020 |
| CN | 111710708 A | 9/2020 |

OTHER PUBLICATIONS

International Search Report (with English Translation) and International Written Opinion mailed on Sep. 3, 2021, in corresponding International Application No. PCT/CN2021/096226; 11 pages.

* cited by examiner

DISPLAY PANEL AND DISPLAY APPARATUS

CROSS-REFERENCE TO RELATED APPLICATIONS

This application is a continuation of International Application No. PCT/CN2021/096226, filed on May 27, 2021, which claims priority to Chinese Patent Application No. 202010621411.8, filed on Jul. 1, 2020, both of which are hereby incorporated by reference in their entireties.

TECHNICAL FIELD

The present application relates to the technical field of display, and particularly relates to a display panel and a display apparatus.

BACKGROUND

With the rapid development of electronic devices, more and more attention is paid to screen-to-body ratios of the electronic devices due to the higher requirements of users.

In conventional electronic devices, such as mobile phones, tablet computers, etc. a plurality of display areas are provided on the device in order to satisfy the display requirements, so as to facilitate the integration of different functional elements. However, in the prior art, since the structural arrangement of a display panel is inappropriate, display differences are likely to be generated at the boundaries between a plurality of display areas, and the problem is difficult to solve.

SUMMARY

Embodiments of the present application provide a display panel and a display apparatus, which enable at least a partial area of the display panel to be light-transmittable and able to perform displaying, facilitate under-screen integration of photosensitive components, and alleviate display differences at the boundaries between multiple display areas.

In one aspect, the embodiments of the present application provides a display panel, the display panel having a first display area and a second display area, a pixel density of the first display area being less than a pixel density of the second display area, the first display area and the second display area having a boundary therebetween, and the display panel comprising: a pixel unit layer comprising: a first pixel group positioned in the first display area and comprising a plurality of first pixel units arranged along an extension direction that the boundary extends along, a first pixel unit comprising a first sub-pixel and a first virtual sub-pixel that are arranged along a column direction; a second pixel group positioned in the second display area and comprising a plurality of second pixel units arranged along the extension direction, each second pixel unit comprising a plurality of second sub-pixels arranged along the column direction; a third pixel group positioned in at least one of the first display area and the second display area and adjacent to the boundary, the third pixel group comprising a plurality of third pixel units arranged along the extension direction, and a third pixel unit comprising a third sub-pixel and/or a third virtual sub-pixel that are arranged along the column direction, wherein each first pixel unit, each second pixel unit and each third pixel unit comprise a same number of sub-pixels, two of the third pixel units of the third pixel group are adjacent to and staggered with one of the first pixel units, and the number of third sub-pixels emitting light of a preset color in the two third pixel units is the same as the number of first sub-pixels emitting light of the preset color in the first pixel unit adjacent to the two third pixel units.

In another aspect, the embodiments of the present application provide a display apparatus including a display panel according to any of the implementations described above.

In the display panel and the display apparatus according to the embodiments of the present application, the display panel has the first display area and the second display area. Since the pixel density of the first display area is less than the pixel density of the second display area so that the light transmittance of the first display area is greater than the light transmittance of the second display area, in the display panel, photosensitive components can be integrated on the back of the first display area, so as to realize under-screen integration of the photosensitive components such as a camera, and at the same time, the first display area can display images, which can increase the display area of the display panel and realize a full-screen design of the display apparatus.

Further, since the pixel densities of the first display area and the second display area are different, a display brightness difference, such as a bright line or a dark line, is likely to exist in an area near the boundary. According to the display panel of the embodiments of the present application, the third pixel group is positioned in at least one of the first display area and the second display area and is adjacent to the boundary, and the number of third sub-pixels emitting light of the preset color in the two third pixel units is the same as the number of first sub-pixels emitting light of the preset color in the first pixel unit adjacent to the two third pixel units, so that the number of the sub-pixels emitting light of the same color at both sides of the boundary is appropriate. Furthermore, by controlling the display brightness of the third sub-pixel to be the same as the display brightness of the second sub-pixel emitting light of the same color, the boundary between the second display area with a higher pixels per inch (PPI) and the first display area with a lower PPI in the display image can be alleviated, so as to avoid the appearance of an obvious bright line or dark line at the boundary between the two display areas, thereby improving the display effect.

DETAILED DESCRIPTION

Features and exemplary embodiments of various aspects of the present application are described in detail below.

Furthermore, the features, structures, or characteristics described below may be combined in any suitable manner in one or more embodiments.

In electronic devices such as mobile phones and tablets, photosensitive components (e.g., front cameras, infrared light sensors, and proximity light sensors) are required to be integrated on the side where display panels are provided. In some embodiments, light-transmitting display areas may be provided on the above-mentioned electronic devices, and the photosensitive components may be arranged on the back of the light-transmitting display areas, so that full-screen display by the electronic devices can be realized with the normal operation of the photosensitive components being ensured.

In order to improve a light transmittance of a light-transmitting display area and facilitate the arrangement of a pixel driving circuit for sub-pixels in the light-transmitting display area, it is often necessary to reduce a PPI of the light-transmitting display area and even a part of the display area around the light-transmitting display area, so that the PPI of the part of the display area is lower than a PPI of the main display area of the display panel. At this time, when displaying is performed by the display panel, an obvious display boundary often exists between the display area with a higher PPI and the display area with a lower PPI, thus affecting the display effect.

In order to solve the above-mentioned problems, embodiments of the present application provide a display panel and a display apparatus. Various embodiments of the display panel and the display apparatus will be described below with reference to the accompanying drawings.

The embodiments of the present application provide a display panel 100 which may be an organic light emitting diode (OLED) display panel.

Figure 1:
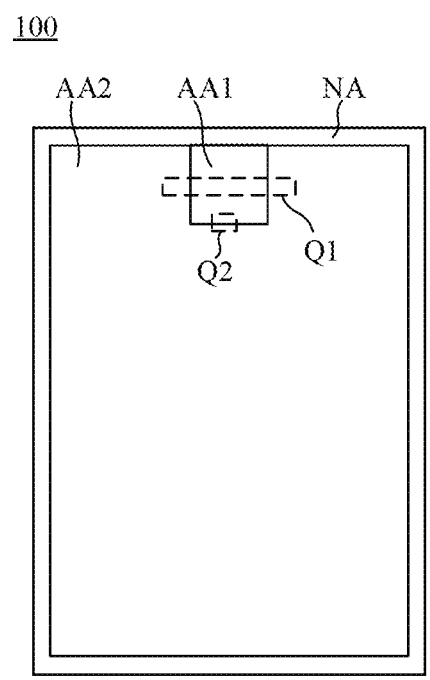
FIG. 1 illustrates a schematic structural diagram of a display panel according to an embodiment of the present application.

As shown in FIG. 1, the display panel 100 includes a first display area AA1, a second display area AA2, and a non-display area NA surrounding the first display area AA1 and the second display area AA2. A pixel density of the first display area AA1 is less than a pixel density of the second display area AA2. A light transmittance of the first display area AA1 is greater than a light transmittance of the second display area AA2.

Optionally, the light transmittance of the first display area AA1 is greater than or equal to 15%, greater than 40%, or even higher. In the embodiments of the present application, a light transmittance of at least some of the functional film layers of the display panel 100 is greater than 80%, and a light transmittance of at least some of the functional film layers is even greater than 90%.

According to the embodiments of the present application, the light transmittance of the first display area AA1 of the display panel 100 is greater than the light transmittance of the second display area AA2, so that in the display panel 100, photosensitive components can be integrated on the back side of the first display area AA1, achieving the under-screen integration of a photosensitive component 200 such as a camera. At the same time, the first display area AA1 can display images, which increases the display area of the display panel 100 and realizes a full-screen design of the display apparatus.

Figure 2:
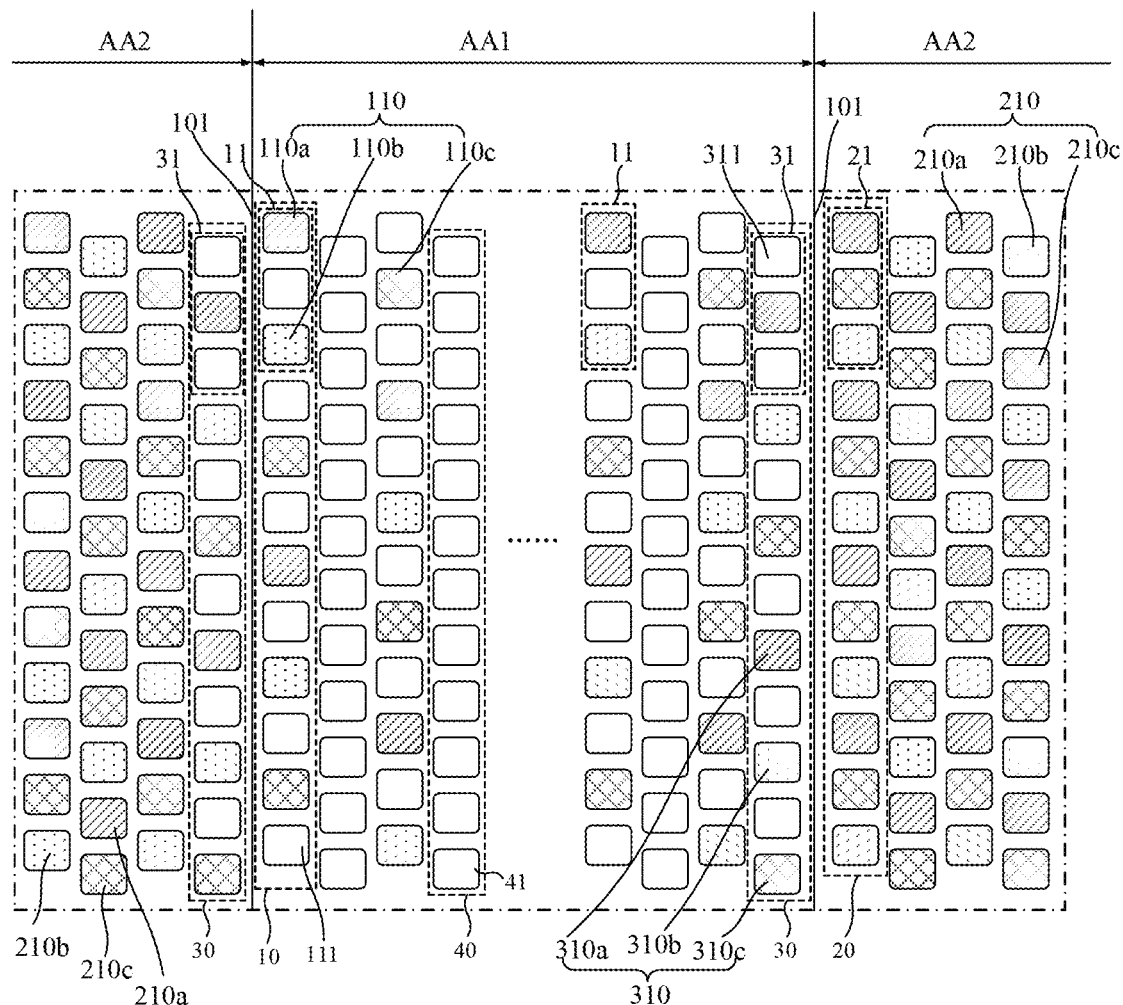
FIG. 2 is an enlarged partial schematic top view of an example pixel arrangement in the region Q1 as shown in FIG. 1.

As shown in FIG. 1 and FIG. 2, the first display area AA1 and the second display area AA2 of the display panel 100 have a boundary therebetween according to an embodiment of the present application. For example, the first display area AA1 and the second display area AA2 have a first boundary 101 therebetween. The display panel 100 includes a pixel unit layer. The pixel unit layer includes a first pixel group 10, a second pixel group 20 and a third pixel group 30. The first pixel group 10 is positioned in the first display area AA1, and includes a plurality of first pixel units 11 arranged along an extension direction that the boundary extends along. The first pixel unit 11 includes a first sub-pixel 110 and a first virtual sub-pixel 111 that are arranged along a column direction. The second pixel group 20 is positioned in the second display area AA2, and includes a plurality of second pixel units 21 arranged along the extension direction that the boundary extends along. The second pixel unit 21 includes a plurality of second sub-pixels 210 arranged along the column direction. The third pixel group 30 is positioned in at least one of the first display area AA1 and the second display area AA2 and is adjacent to the boundary. The third pixel group 30 includes a plurality of third pixel units 31 arranged along the extension direction that the boundary extends along. The third pixel unit 31 includes a third sub-pixel 310 and/or a third virtual sub-pixel 311 that are arranged along the column direction. Each first pixel unit 11, each second pixel unit 21 and each third pixel unit 31 include a same number of sub-pixels. Two of the third pixel units 31 of the third pixel group 30 are adjacent to and staggered with one corresponding first pixel unit 11, where the number of third sub-pixels 310 emitting a preset light color in the two third pixel units 31 is the same as the number of first sub-pixels 110 emitting the same light color in the adjacent first pixel unit 11. The same number of sub-pixels in each first pixel unit 11, each second pixel unit 21 and each third pixel unit 31 means that the total number of sub-pixels in each first pixel unit 11, each second pixel unit 21 and each third pixel unit 31 (including the sum of the number of light-emitting sub-pixels and the number of virtual sub-pixels in each pixel unit) is the same.

The virtual sub-pixel can be understood with the following explanation: under the sub-pixel arrangement pattern, the virtual sub-pixel occupies the position of a real sub-pixel, and has the same shape and size as the corresponding real sub-pixel, that is, the position occupied by the virtual sub-pixel is a non-light-emitting area. By setting appropriate virtual sub-pixels, the sub-pixels in the first display area AA1 and the second display area AA2 can be made using the same mask plate, and at the same time, the boundary between the first display area AA1 and the second display area AA2 can be effectively alleviated, so as to reduce the display difference between the first display area AA1 and the second display area AA2. As shown in FIG. 2, the two of the third pixel units 31 of the third pixel group 30 being adjacent to and staggered with one corresponding first pixel unit 11 means that the two third pixel units 31 are adjacent to the one first pixel unit 11 and arranged in different rows and different columns from the first pixel unit 11.

When the pixel densities of the first display area AA1 and the second display area AA2 are different, a display brightness boundary, such as a display bright line or a display dark line, is likely to exist in an area close to the boundary. In the display panel 100 according to an embodiment of the present application, the number of the third sub-pixels 310 emitting light of the preset color in the two third pixel units 31 is the same as the number of the first sub-pixels 110 emitting light of the same color in the adjacent first pixel unit 11, so that the number of the sub-pixels emitting light of the same color on the two sides of the boundary is appropriate. Further, by controlling the display brightness of the third sub-pixel 310 to be the same as the display brightness of the second sub-pixel 210 emitting light of the same color, the boundary between the second display area AA2 with a higher pixels per inch (PPI) and the first display area AA1 with a lower PPI can be alleviated in the display image, so as to avoid the appearance of an obvious bright line or dark line at the boundary between the two display areas, thereby improving the display effect.

Figure 3:
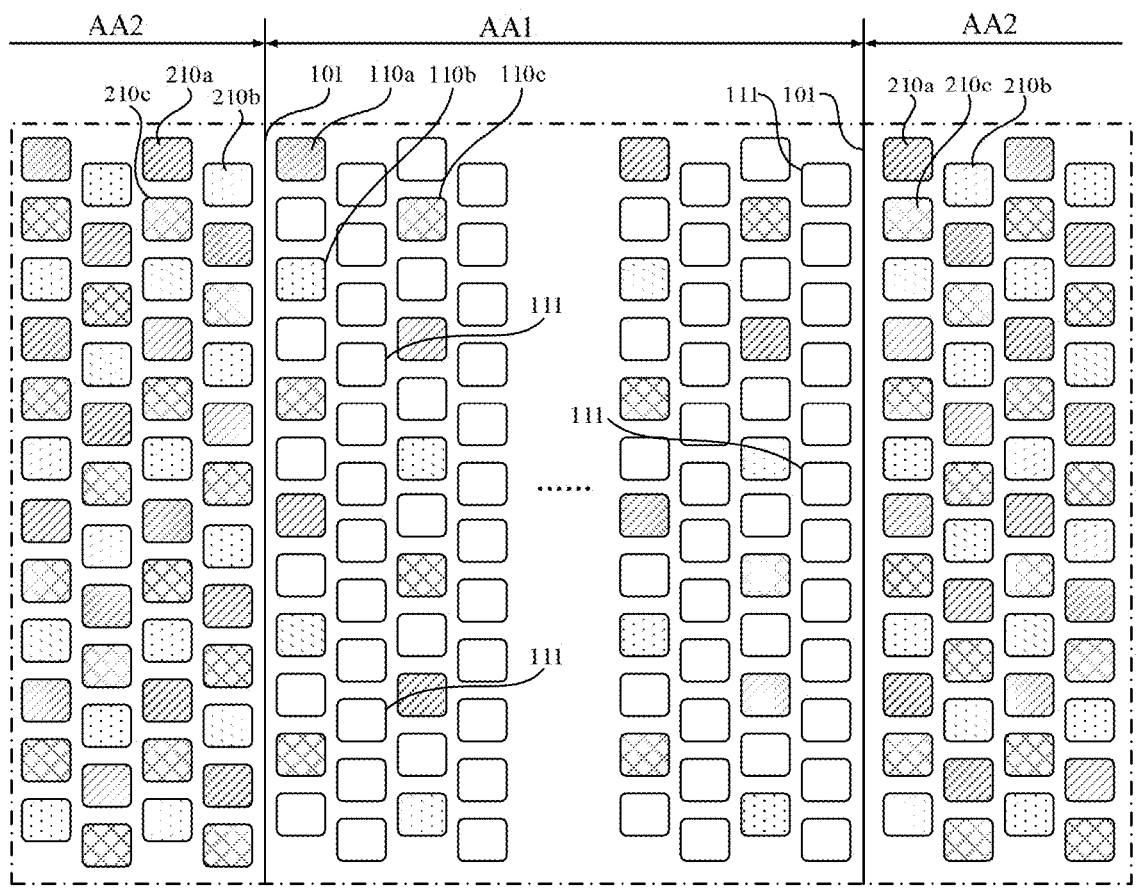
FIG. 3 is an enlarged partial schematic top view of a comparative example of pixel arrangement corresponding to the Region Q1 in FIG. 1.

In an example, a column of sub-pixels in the second display area AA2 at the left side boundary of the first display area AA1 with the second display area AA2 shown in FIG. 3 can be processed. For example, in the two third pixel units 31 and the corresponding first pixel unit 11, a third sub-pixel 310 emitting light of the preset color in one of the two third pixel units 31 does not perform displaying. That is, the third sub-pixel 310 is set as a virtual sub-pixel, so that the third pixel group 30 on the left side shown in FIG. 2 is obtained.

Further, some sub-pixels are arranged on positions occupied by a column of virtual sub-pixels in the first display area AA1 at the right side boundary on the first display area AA1 with the second display area AA2 shown in FIG. 3. For example, in the two third pixel units 31 and the corresponding first pixel unit 11, a virtual sub-pixel in one of the two third pixel units 31 is set as the third sub-pixel 310 emitting the light of the preset color for displaying, so that the third pixel group 30 on the right side shown in FIG. 2 is obtained.

According to an embodiment of the present application, the third pixel group 30 can be obtained by changing only one column of sub-pixels, so that the process difficulty and complexity is reduced. A column of third sub-pixels 310 is included in the third pixel group 30, so that the left side boundary or the right side boundary of the first display area AA1 with the second display area AA2 can be alleviated as much as possible.

According to the comparison between the embodiment of FIG. 2 and the comparative example of FIG. 3, it can be seen that in an embodiment of the present application, the total number of the third sub-pixels 310 and the first sub-pixels 110 emitting light of a same color on both sides of the left-side boundary of the first display area AA1 with the second display area AA2 is less than the number of the sub-pixels emitting light of the same color in the comparative example. By appropriately setting the light-emitting brightness of the third sub-pixels 310 and the first sub-pixels 110, the problem of the bright line of the display caused by the pixel arrangement structure in the comparative example can be effectively alleviated. Further, in an embodiment of the present application, the total number of the third sub-pixels 310 and the first sub-pixels 110 emitting light of a same color on both sides of the right side boundary of the first display area AA1 with the second display area AA2 is greater than the number of the sub-pixels emitting light of the same color in the comparative example. By appropriately setting the light-emitting brightness of the third sub-pixels 310 and the first sub-pixels 110, the problem of dark line of the display caused by the pixel structure in the comparative example can be effectively alleviated.

In some embodiments, the boundary includes a first boundary 101 extending along the column direction. The third pixel group 30 includes a plurality of third sub-pixels 310 emitting light of different colors. Third sub-pixels 310 are staggered with and arranged in a same manner along an extension direction of the first boundary 101 with first sub-pixels 110 emitting same colors with the third sub-pixels 310. In particular implementation, in FIG. 2, the column direction is the up-down direction. In this situation, third sub-pixels 310 being staggered with and arranged in a same manner along an extension direction of the first boundary 101 with first sub-pixels 110 emitting same colors with the third sub-pixels 310 means that and third sub-pixels 310 emitting light of a color in the two third pixel units 31 are positioned above or below first sub-pixel 110 emitting the same color in the corresponding first pixel unit 11. With the above arrangement, the third sub-pixels 310 in the third pixel group 30 are regularly arranged and the display effect is improved.

In some embodiments, the third sub-pixels 310 of the third pixel group 30 includes a third sub-pixel emitting red light 310a, a third sub-pixel emitting blue light 310b, and a third sub-pixel emitting green light 310c. The first sub-pixels 110 of the first pixel group 10 includes a first sub-pixel emitting red light 110a, a first sub-pixel emitting blue light 110b, and a first sub-pixel emitting green light 110c. Along the column direction, a staggered arrangement manner of the third sub-pixel emitting red light 310a relative to the first sub-pixel emitting red light 110a, a staggered arrangement manner of the third sub-pixel emitting blue light 310b relative to the first sub-pixel emitting blue light 110b and a staggered arrangement manner of the third sub-pixel emitting green light 310c relative to the first sub-pixel emitting green light 110c are the same.

Specifically, as shown in FIG. 2, the third sub-pixel emitting red light 310a is positioned below the first sub-pixel emitting red light 110a along the column direction, the third sub-pixel emitting blue light 310b is positioned on the lower side of the first sub-pixel emitting blue light 110b along the column direction, and the third sub-pixel emitting green light 310c is positioned on below the first sub-pixel emitting green light 110c along the column direction. With the above-mentioned arrangement, third sub-pixels 310 emitting light of different colors are arranged in every other row, the third sub-pixels 310 in two adjacent third pixel units can emit white light in combination, thereby preventing problems such as non-uniform display in the third pixel group 30.

The second pixel unit 20 may include a second sub-pixel emitting red light 210a, a second sub-pixel emitting blue light 210b and a second sub-pixel emitting green light 210c, so as to realize colorful display.

The number of sub-pixels (including the sub-pixels emitting light and the virtual sub-pixels) included in each first pixel unit 11, each second pixel unit 21, or each third pixel unit 31, and the colors of the sub-pixels may be adjusted according to the design requirements of the display panel 100, and thus are not limited to the examples of the embodiments described above. Further, the arrangement between the sub-pixels in each first pixel unit 11, each second pixel unit 21, or each third pixel unit 31 is not limited to the examples of the embodiments described above.

In some embodiments, the third pixel group 30 is between the first pixel group 10 and the second pixel group 20 in the row direction of the display panel 100, and a column of third pixel groups 30 are arranged in the row direction of the display panel 100 to effectively alleviate the display bright line or the display dark line on the display panel 100 at the boundary between the first display area AA1 and the second display area AA2.

With further reference to FIG. 2, in some embodiments, the pixel unit layer further includes a virtual pixel group 40 positioned between two adjacent first pixel groups 10. The virtual pixel group 40 includes a plurality of fourth virtual sub-pixels 41 arranged in the column direction. With the above arrangement, the light transmittance of the first display area AA1 can be increased to facilitate integration of the under-screen camera.

In some embodiments, a first virtual sub-pixel 111 or a fourth virtual sub-pixel 41 is arranged between at least any two first sub-pixels 110, so that first sub-pixels 110 of various colors in the first display area AA1 can be more evenly distributed, improving the color uniformity of the display.

The first sub-pixels 110 emitting a color in a column are positioned in a different row from the first sub-pixels 110 emitting the same color in an adjacent column. Alternatively, the first sub-pixels 110 emitting a color in a row are positioned in a different column from the first sub-pixels 110 emitting the same color in an adjacent row. The first sub-pixels 110 of various colors in the first display area AA1 are further uniformly distributed, further improving the color uniformity of the display.

Figure 4:
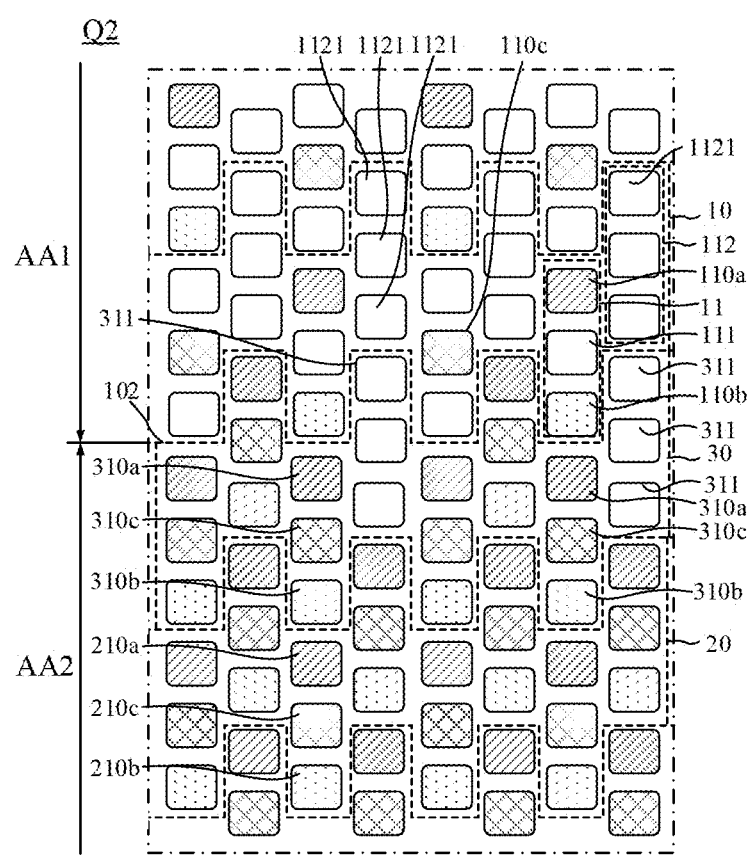
FIG. 4 is an enlarged partial schematic top view of an example of pixel arrangement in the Q2 region of FIG. 1.

With further reference to FIG. 4, in order to effectively alleviate the display difference that exists between the first display area AA1 and the second display area AA2, while avoiding the problem of display color shift. In some embodiments, the boundary may include a second boundary 102 extending in a row direction intersecting the column direction. the third pixel group 30 includes a plurality of third sub-pixels 310 emitting light of different colors, and a staggered arrangement manner of third sub-pixels 310 emitting light of a color relative to first sub-pixel 110 emitting light of the color along an extension direction of the second boundary 102 is different than a staggered arrangement manner of third sub-pixels 310 emitting light of another color relative to first sub-pixel 110 emitting light of the another color along the extension direction of the second boundary 102, which dispose all the third sub-pixels 310 in one of the two third pixel units 31 corresponding to the first pixel unit 11 and all the third virtual sub-pixels 311 in the other of the two third pixel 31 units.

A structure in which all the third sub-pixels 310 are disposed in one of the two third pixel units 31 corresponding to the first pixel unit 11 and all the third virtual sub-pixels 311 are disposed in the other of the two third pixel 31 units is specifically described below.

The second display area AA2 may surround at least a part of the first display area AA1, in which case the problem of bright lines or dark lines are likely to exist between the upper side or the lower side between the second display area AA2 and the first display area AA1. With reference to FIG. 4, the boundary may include a second boundary 102. In this case, when all the third sub-pixels 310 are disposed in one of the two third pixel units 31 corresponding to the first pixel unit 11 and all the third virtual sub-pixels 311 are disposed in the other of the two third pixel 31 units, the third pixel unit 31 whose sub-pixels are all third sub-pixels 310 and the third pixel unit 31 whose sub-pixels are all third virtual sub-pixels 311 are arranged in columns spaced by one column. The second boundary 102 extending in the row direction means that the second boundary 102 extends in the left-right direction. The second boundary 102 may be a straight line, a curved line or a broken line. The second boundary 102 is illustrated as extending along a broken line herein.

When the boundary includes a second boundary 102 extending along the row direction, the third pixel group 30 includes two third pixel units 31 which are adjacent to and staggered with a corresponding one first pixel unit 11. In this case, the two third pixel units 31 are positioned in a different column than the corresponding first pixel unit 11, and the two third pixel units 31 are positioned in an adjacent column of the corresponding first pixel unit 11. The plurality of first pixel units 11 may include a first sub-pixel emitting red light 110a, a first sub-pixel emitting blue light 110b, and a first sub-pixel emitting green light 110c. Along the extension direction of the second boundary 102, a staggered arrangement manner of the third sub-pixel emitting red light 310a relative to the first sub-pixel emitting red light 110a is different than the staggered arrangement of the third sub-pixel emitting blue light 310b relative to the first sub-pixel emitting blue light 110b and the staggered arrangement of the third sub-pixel emitting green light 310c relative to the first sub-pixel emitting green light 110c.

Specifically, in the two third pixel units 31 and the corresponding first pixel unit 11, along the extension direction of the second boundary 102, the third sub-pixel emitting red light 310a is positioned in a column on a left side of the first sub-pixel emitting red light 110a, the third sub-pixel emitting blue light 310b is positioned in a column on a left side of the first sub-pixel emitting blue light 110b, and the third sub-pixel emitting green light 310c is positioned in a column on a right side of the first sub-pixel emitting green light 110c, so that one of the two third pixel units 31 includes the first sub-pixel emitting red light 110a, the first sub-pixel emitting blue light 110b and the first sub-pixel emitting green light 110c, and the other of the two third pixel units 31 includes only third virtual sub-pixels 311.

Figure 5:
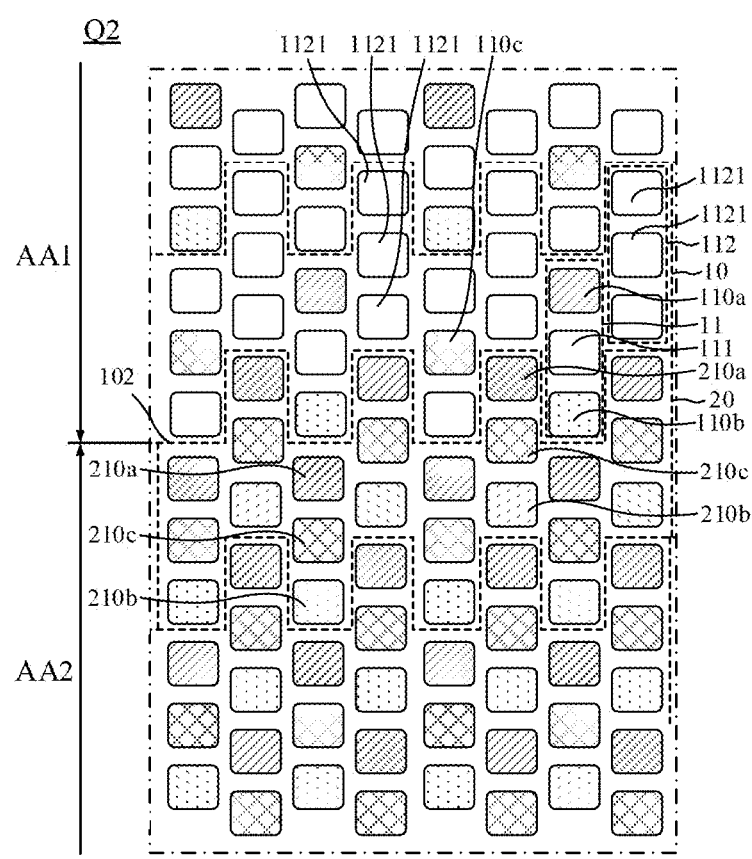
FIG. 5 is an enlarged partial schematic top view of a comparative example of pixel arrangement corresponding to the region Q2 in FIG. 1.

For a better understanding of the present application, as shown in FIG. 5, a row of second pixel units 21 in the second display area AA2 at the lower boundary of the first display area AA1 with the second display area AA2 shown in FIG. 5 may be processed to obtain the lower third pixel group 30 shown in FIG. 4. Further, the same processing may be performed on the sub-pixels at the upper boundary of the first display area AA1 with the second display area AA2. According to the comparison between FIG. 4 and FIG. 5, it can be seen that in an embodiment of the present application, the total number of the third sub-pixels 310 and the first sub-pixels 110 emitting light of a same color on both sides of the lower side or upper side boundary of the first display area AA1 with the second display area AA2 is different than the number of the sub-pixels emitting light of the same color in the comparative example, and the light-emitting brightness of the third sub-pixel 310 and the first sub-pixel 110 can be appropriately set so as to smooth the transition between the first display area AA1 and the second display area AA2, thereby effectively alleviating the problem of bright lines or dark lines caused by the pixel arrangement structure in the comparative example.

With reference to FIG. 4, in some embodiments, the first pixel group 10 further includes a plurality of virtual pixel units 112 positioned between adjacent first pixel units 11, and the virtual pixel unit 112 includes a plurality of fifth virtual sub-pixels 1121 arranged along the column direction. With the above arrangement, the pixel density in the first display area AA1 can be reduced, which increases the light transmittance of the first display area AA1.

In some embodiments, the third pixel group 30 is positioned in the first display area AA1 and the second display area AA2. The third pixel group 30 positioned in the first display area AA1 and the first pixel group 10 positioned in the first display area AA1 form a first pixel arrangement structure. The third pixel group 30 positioned in the second display area AA2 and the second pixel group 20 positioned in the second display area AA2 form a second pixel arrangement structure. The first pixel arrangement structure is the same as the second pixel arrangement structure. With the above-mentioned arrangement, not only the problem of display difference at the boundary between the first display area AA1 and the second display area AA2 can be alleviated, but also the display uniformity of the first display area AA1 and the second display area AA2 can be improved, and the appearance of an obvious boundary between the two display areas can be further avoided, so as to improve the display effect.

According to the display panel 100 of the embodiments of the present application, since there are both sub-pixels capable of emitting light and virtual sub-pixels not emitting light in the first display area AA1, the actual PPI of the first display area AA1 can be reduced. Only the sub-pixels capable of emitting light need to be connected to the driving signal lines, reducing the number of arranged driving signal lines in the first display area AA1, facilitating the improvement of the light transmittance of the first display area AA1.

In some embodiments, the display panel 100 further includes a substrate, a device layer between the substrate and the pixel unit layer, and a pixel definition layer on a side of the device layer away from the substrate. The substrate may be made of a light-transmitting material such as glass, polyimide (PI), etc. The device layer may include a first pixel circuit and a second pixel circuit. The first pixel circuit is electrically connected to the first sub-pixels 110 for driving the first sub-pixels 110 to display. A second pixel circuit may be electrically connected to the second sub-pixels 210 and the third sub-pixels 310 for driving the second sub-pixels 210 and the third sub-pixels 310 to display.

In some embodiments, the first sub-pixel 110 includes a first light emitting structure, a first electrode, and a second electrode that are stacked. The pixel defining layer includes a first pixel opening. The first light emitting structure is positioned within the first pixel opening. The first electrode is positioned on a side of the first light emitting structure facing the substrate, and the second electrode is positioned on a side of the first light emitting structure away from the substrate. One of the first electrode and the second electrode is an anode and the other is a cathode.

In some embodiments, the second sub-pixel 210 includes a second light emitting structure, a third electrode, and a fourth electrode. The pixel defining layer includes a second pixel opening. The second light emitting structure is positioned within the second pixel opening. The third electrode is positioned on a side of the second light emitting structure facing the substrate, and the fourth electrode is positioned on a side of the second light emitting structure facing away from the substrate. One of the third electrode and the fourth electrode is an anode and the other is a cathode.

In some embodiments, the third sub-pixel 310 includes a third light emitting structure, a fifth electrode, and a sixth electrode. The pixel defining layer includes a third pixel opening. The third light emitting structure is positioned within the third pixel opening. The fifth electrode is positioned on a side of the third light emitting structure facing the substrate, and the sixth electrode is positioned on a side of the third light emitting structure facing away from the substrate. One of the fifth electrode and the sixth electrode is an anode and the other is a cathode.

In an embodiment, the first electrode, the third electrode, and the fifth electrode are taken as anodes, and the second electrode, the fourth electrode, and the sixth electrode are taken as cathodes, for illustration.

The first light-emitting structure, the second light-emitting structure and the third light-emitting structure may each include an OLED light-emitting layer, and each may further include at least one of a hole injection layer, a hole transport layer, an electron injection layer or an electron transport layer according to the design requirements of the first light-emitting structure, the second light-emitting structure and the third light-emitting structure.

In some embodiments, the first electrode is a light-transmissive electrode. In some embodiments, the first electrode includes an indium tin oxide (ITO) layer or an indium zinc oxide layer. In some embodiments, the first electrode is a reflective electrode including a first light-transmissive conductive layer, a reflective layer on the first light-transmissive conductive layer, and a second light-transmissive conductive layer on the reflective layer. The first light-transmitting conductive layer and the second light-transmitting conductive layer may be ITO, indium zinc oxide, etc. The reflective layer may be a metal layer, for example made of a silver material. The third electrode and the fifth electrode may each be configured of the same material as the first electrode.

In some embodiments, the second electrode includes a magnesium-silver alloy layer. The fourth electrode and the sixth electrode may each be configured of the same material as the second electrode. In some embodiments, the second electrode, the fourth electrode, and the sixth electrode may be interconnected as a common electrode.

In some embodiments, an orthographic projection of each first light emitting structure on the substrate consists of one first pattern unit or consists of a concatenation of two or more first pattern units. The first pattern unit includes at least one selected from the group including a circular shape, an elliptical shape, a dumbbell shape, a gourd shape, and a rectangular shape.

In some embodiments, an orthographic projection of each third electrode on the substrate consists of one second pattern unit or consists of a concatenation of two or more second pattern units. The second pattern unit includes at least one selected from the group including a circular shape, an elliptical shape, a dumbbell shape, a gourd shape, and a rectangular shape.

In some embodiments, an orthographic projection of each third light emitting structure on the substrate consists of one third pattern unit or consists of a concatenation of two or more third pattern units. The third pattern unit includes at least one selected from the group including a circular shape, an elliptical shape, a dumbbell shape, a gourd shape, and a rectangular shape.

In some embodiments, an orthographic projection of each fifth electrode on the substrate consists of one fourth pattern unit or consists of a concatenation of two or more fourth pattern units. The fourth pattern unit includes at least one selected from the group including a circular shape, an elliptical shape, a dumbbell shape, a gourd shape, and a rectangular shape.

The embodiments of the present application further provide a display apparatus that may include the display panel 100 according to any of the embodiments described above. Hereinafter, a display apparatus according to an embodiment including the display panel 100 according to the above-described embodiments will be described as an example.

Figure 6:
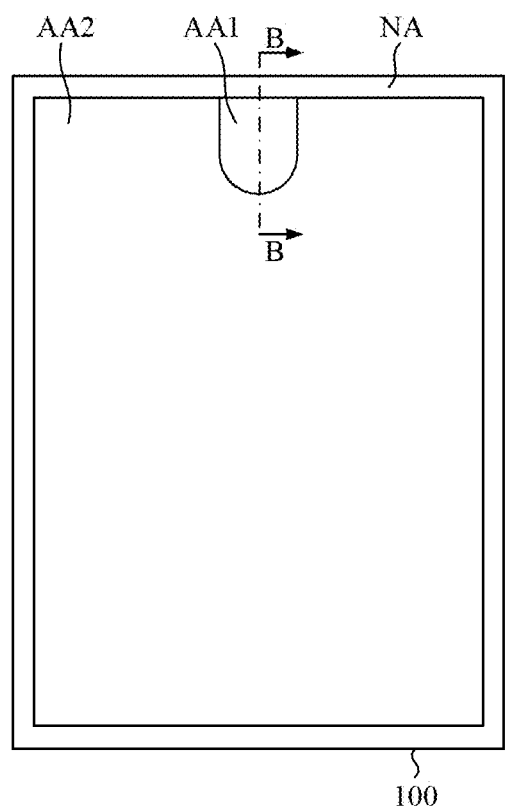
FIG. 6 illustrates a schematic top view of a display apparatus according to an embodiment of the present application.
Figure 7:
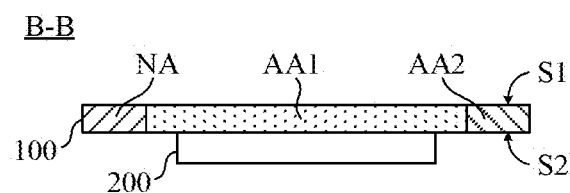
FIG. 7 is an exemplary cross-sectional view taken along line B-B of FIG. 6.

With reference to FIG. 6 and FIG. 7, in the display apparatus according to this embodiment, the display panel 100 may be the display panel 100 according to one of the above-described embodiments. The display panel 100 includes a first display area AA1 and a second display area AA2. The light transmittance of the first display area AA1 is greater than the light transmittance of the second display area AA2.

The display panel 100 includes a plurality of first surfaces S1 and a plurality of second surfaces S2 opposed to the first surfaces S1 and the first surface S1 is a displaying surface. The display apparatus further includes a photosensitive component 200 positioned on the second surface S2 side of the display panel 100 whose position is corresponding to a position of the first display area AA1.

The photosensitive component 200 may be an image capture apparatus for capturing external image information. In the embodiments, the photosensitive component 200 may be a complementary metal oxide semiconductor (CMOS) image capture apparatus. In some other embodiments, the photosensitive component 200 may be a charge-coupled device (CCD) image capturing apparatus or other form of image capturing apparatus. It can be understood that, the photosensitive component 200 may not be limited to an image capturing apparatus. For example, in some embodiments, the photosensitive component 200 may be a light sensor such as an infrared sensor, a proximity sensor, an infrared lens, a flood sensing element, an ambient light sensor, and a dot matrix projector. In addition, in the display apparatus, other components may further be integrated on the second surface S2 of the display panel 100, such as an earpiece, a speaker, etc.

In the display apparatus according to the present application, the light transmittance of the first display area AA1 is greater than the light transmittance of the second display area AA3, so that in the display panel 100, the photosensitive component 200 can be integrated on the back side of the first display area AA1, achieving the under-screen integration of the photosensitive component 200 such as a camera. At the same time, the first display area AA1 can display images, which increases the display area of the display panel 100 and realizes a full-screen design of the display apparatus.

Further, since the pixel densities of the first display area AA1 and the second display area AA2 are different, a display brightness difference, such as a bright line or a dark line, is likely to exist in an area near the boundary. According to the display panel 100 of the embodiments of the present application, the third pixel group 30 is positioned in at least one of the first display area AA1 and the second display area AA2 and is adjacent to the boundary, and the number of the third sub-pixels 310 emitting light of the preset color in the two third pixel units 31 is the same as the number of the first sub-pixels 110 emitting light of the same color in the first pixel unit 11 adjacent to the two third pixel units 31, so that the number of the sub-pixels emitting light of the same color on both sides of the boundary is appropriate. Furthermore, by controlling the display brightness of the third sub-pixel 310 to be the same as the display brightness of the second sub-pixel 210 emitting light of the same color, in the display image, the boundary between the second display area AA2 with a higher pixels per inch (PPI) and the first display area AA1 with a lower PPI can be alleviated, so as to avoid the appearance of an obvious bright line or dark line at the boundary between the two display areas, thereby improving the display effect.

As with the embodiments described herein, these embodiments are not intended to be exhaustive or to limit the application to only the specific embodiments described. Obviously, many modifications and variations are possible in light of the above teaching. The embodiments were chosen and described in order to best explain the principles of the invention and its practical application to thereby enable others skilled in the art to best utilize the invention and various embodiments with various modifications as are suited to the particular use contemplated. This application is limited only by the claims and the full scope and equivalents thereof.

What is claimed is:

1. A display panel having a first display area and a second display area, a pixel density of the first display area being less than a pixel density of the second display area, the first display area and the second display area having a boundary therebetween, the display panel comprising:
    a pixel unit layer comprising:
        a first pixel group positioned in the first display area and comprising a plurality of first pixel units arranged along an extension direction that the boundary extends along, each first pixel unit comprising a first sub-pixel and a first virtual sub-pixel that are arranged along a column direction;
        a second pixel group positioned in the second display area and comprising a plurality of second pixel units arranged along the extension direction, each second pixel unit comprising a plurality of second sub-pixels arranged along the column direction;
        a third pixel group positioned in at least one of the first display area and the second display area and adjacent to the boundary, the third pixel group comprising a plurality of third pixel units arranged along the extension direction, each third pixel unit comprising a third sub-pixel and/or a third virtual sub-pixel that are arranged along the column direction, and
    wherein each first pixel unit, each second pixel unit and each third pixel unit comprise a same number of sub-pixels, two of the third pixel units of the third pixel group are adjacent to and staggered with one of the first pixel units, and the number of third sub-pixels emitting light of a preset color in the two third pixel units is the same as the number of first sub-pixels emitting light of the preset color in the first pixel unit adjacent to the two third pixel units.

2. The display panel according to claim 1, wherein the boundary comprises a first boundary extending along the column direction, the third pixel group comprises a plurality of third sub-pixels emitting light of different colors, and third sub-pixels are staggered with and arranged in a same manner along an extension direction of the first boundary with first sub-pixels emitting same colors with the third sub-pixels.

3. The display panel according to claim 2, wherein the third sub-pixels of the third pixel group comprises a third sub-pixel emitting red light, a third sub-pixel emitting blue light and a third sub-pixel emitting green light, and the first sub-pixels of the first pixel group comprises a first sub-pixel emitting red light, a first sub-pixel emitting blue light and a first sub-pixel emitting green light,
    along the column direction, a staggered arrangement manner of the third sub-pixel emitting red light relative to the first sub-pixel emitting red light, a staggered arrangement manner of the third sub-pixel emitting blue light relative to the first sub-pixel emitting blue light and a staggered arrangement manner of the third sub-pixel emitting green light relative to the first sub-pixel emitting green light are the same.

4. The display panel according to claim 3, wherein the third sub-pixel emitting red light is positioned below the first sub-pixel emitting red light along the column direction, the third sub-pixel emitting blue light is positioned below the first sub-pixel emitting blue light along the column direction, and the third sub-pixel emitting green light is positioned below the first sub-pixel emitting green light along the column direction.

5. The display panel according to claim 2, wherein the pixel unit layer further comprises:
    a virtual pixel group positioned between two adjacent first pixel groups and comprising a plurality of fourth virtual sub-pixels arranged along the column direction.

6. The display panel according to claim 5, wherein one of the first virtual sub-pixels or one of the fourth virtual sub-pixels is arranged between two of the first sub-pixels.

7. The display panel according to claim 6, wherein the first sub-pixels emitting a color in a column are positioned in a different row from the first sub-pixels emitting the same color in an adjacent column, or, the first sub-pixels emitting a color in a row are positioned in a different column from the first sub-pixels emitting the same color in an adjacent row.

8. The display panel according to claim 1, wherein the second pixel group comprises a second sub-pixel emitting red light, a second sub-pixel emitting blue light, and a second sub-pixel emitting green light.

9. The display panel according to claim 1, wherein the boundary comprises a second boundary extending along a row direction intersecting with the column direction, the third pixel group comprises a plurality of third sub-pixels emitting light of different colors, and a staggered arrangement manner of third sub-pixels emitting light of a color relative to first sub-pixel emitting light of the color along an extension direction of the second boundary is different than a staggered arrangement manner of third sub-pixels emitting light of another color relative to first sub-pixel emitting light of the another color along the extension direction of the second boundary, which dispose all the third sub-pixels in one of the two third pixel units corresponding to the first pixel unit and all the third virtual sub-pixels in the other of the two third pixel units.

10. The display panel according to claim 9, wherein the second boundary is a straight line, a curved line or a broken line.

11. The display panel according to claim 9, wherein the two third pixel units are positioned in different columns from the corresponding first pixel unit, and the two third pixel units are positioned in columns adjacent to the corresponding first pixel unit.

12. The display panel according to claim 9, wherein along the extension direction of the second boundary, a staggered arrangement manner of a third sub-pixel emitting red light relative to a first sub-pixel emitting red light, a staggered arrangement manner of a third sub-pixel emitting blue light relative to a first sub-pixel emitting blue light and a staggered arrangement manner of a third sub-pixel emitting green light relative to a first sub-pixel emitting green light are different.

13. The display panel according to claim 12, wherein in the two third pixel units and the corresponding first pixel unit, along the extension direction of the second boundary, the third sub-pixel emitting red light is positioned in a column on a left side of the first sub-pixel emitting red light, the third sub-pixel emitting blue light is positioned in a column on a left side of the first sub-pixel emitting blue light, and the third sub-pixel emitting green light is positioned in a column on a left side of the first sub-pixel emitting green light.

14. The display panel according to claim 9, wherein the third pixel unit whose sub-pixels are all third sub-pixels and the third pixel unit whose sub-pixels are all third virtual sub-pixels are arranged in columns spaced by one column.

15. The display panel according to claim 9, wherein the first pixel group further comprises a plurality of virtual pixel units between adjacent first pixel units, and each virtual pixel unit comprises a plurality of fifth virtual sub-pixels arranged in the column direction.

16. The display panel according to claim 1, wherein the third pixel group comprises a portion positioned in the first display area and a portion positioned in the second display area, the portion of the third pixel group positioned in the first display area and the first pixel group positioned in the first display area form a first pixel arrangement structure, the portion of the third pixel group positioned in the second display area and the second pixel group positioned in the second display area form a second pixel arrangement structure, and the first pixel arrangement structure is the same as the second pixel arrangement structure.

17. The display panel according to claim 1, wherein display brightness of a third sub-pixel emitting light of a color is the same as display brightness of a second sub-pixel of emitting light of the same color.

18. The display panel according to claim 1, further comprising a substrate, a device layer between the substrate and the pixel unit layer, and a pixel definition layer on a side of the device layer away from the substrate.

19. A display apparatus comprising the display panel according to claim 1.

20. The display apparatus of claim 19, further comprising a photosensitive component corresponding to the first display area.

* * * * *